United States Patent
Bhatia et al.

(10) Patent No.: US 6,528,735 B1
(45) Date of Patent: Mar. 4, 2003

(54) SUBSTRATE DESIGN OF A CHIP USING A GENERIC SUBSTRATE DESIGN

(75) Inventors: Harsaran S. Bhatia, Hopewell Junction, NY (US); Raymond M. Bryant, Hopewell Junction, NY (US); Suresh Kadakia, Poughkeepsie, NY (US); David C. Long, Wappingers Falls, NY (US); Paul R. Walling, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/948,432

(22) Filed: Sep. 7, 2001

(51) Int. Cl.[7] .................................................. H05K 1/16
(52) U.S. Cl. ....................................... 174/260; 174/261
(58) Field of Search ................................ 174/210–266; 439/65–75; 361/792–795; 29/830, 832, 846

(56) References Cited

U.S. PATENT DOCUMENTS

| | | | |
|---|---|---|---|
| 4,361,634 A | 11/1982 | Miller | |
| 4,792,646 A | 12/1988 | Enomoto | |
| 4,814,855 A | 3/1989 | Hodgson et al. | |
| 4,859,806 A | * 8/1989 | Smith | 174/261 |
| 5,006,673 A | 4/1991 | Freyman et al. | |
| 5,074,037 A | 12/1991 | Sutcliffe et al. | |
| 5,200,580 A | * 4/1993 | Sienski | 174/255 |
| 5,295,082 A | 3/1994 | Chang et al. | |
| 5,315,535 A | 5/1994 | Kikuchi et al. | |
| 5,438,166 A | * 8/1995 | Carey et al. | 174/255 |
| 5,478,972 A | * 12/1995 | Mizutani et al. | 174/250 |
| 5,500,804 A | 3/1996 | Honsinger et al. | |
| 5,544,069 A | 8/1996 | Mohsen | |
| 5,565,706 A | 10/1996 | Miura et al. | |
| 5,572,409 A | 11/1996 | Nathan et al. | |
| 5,777,383 A | 7/1998 | Stager et al. | |
| 5,814,847 A | 9/1998 | Shihadeh et al. | |
| 5,837,557 A | 11/1998 | Fulford, Jr. et al. | |
| 5,880,493 A | 3/1999 | Hidaka | |
| 5,914,533 A | 6/1999 | Frech et al. | |
| 6,048,753 A | 4/2000 | Farnworth et al. | |
| 6,133,582 A | 10/2000 | Osann, Jr. et al. | |

FOREIGN PATENT DOCUMENTS

JP 05-243535 9/1993

* cited by examiner

Primary Examiner—Albert W. Paladini
Assistant Examiner—Jeremy Norris
(74) Attorney, Agent, or Firm—James J. Cioffi; McGinn & Gibb PLLC

(57) ABSTRACT

A method of substrate design of a multilayer ceramic module that uses menu die of the same size. One of these menu die provides a "generic" substrate design having internal wiring with the greatest number of input/output (I/O) signal leads of all the dies available. Middle (redistribution) layers include electrical interconnections for both power and the I/O signal lead wires between the die interface terminals and a bottom surface metallurgy (BSM) layer that has electrical connector pads by use of a customization layer.

18 Claims, 6 Drawing Sheets

SUBSTRATE DESIGN OF A CHIP USING A GENERIC SUBSTRATE DESIGN

BACKGROUND OF THE INVENTION

1. Field of the Invention

The present invention relates to a method and system of packaging a multi-chip module having the same sized dies and fabricating such a module.

2. Description of the Related Art

As very large scale integrated (VLSI) circuits, known as dies or chips, become more dense, there is a need in the art to have semiconductor packaging structures that can take full advantage of the density and speed of state of the art VLSI devices. Packaging of such devices is by use of multi-chip modules (MCMs), which are normally mounted onto cards or boards. These MCMs accept dies that are bonded to pads on a top surface metallurgy (TSM) layer of the MCM. These TSM pads are interconnected to a bottom surface metallurgy (BSM) layer through vias to pins on a bottom surface by using wiring, wherein the vias pass through multiple intermediary redistribution layers and wiring layers. The TSM layer typically has pads made by controlled collapse chip connections (commonly known as C-4). The BSM layer is solder-ball-connect technology. The MCM multi-chip module technology represents a revolutionary advance in packaging and provides the high-performance wiring needed to exploit the gains achieved by today's VLSI devices. The MCM technology is taught in U.S. Pat. No. 5,914,533, which is hereby incorporated by reference.

Present day high performance VLSI chips have a large number of external input/output connection (called I/Os), such as pads, wire bands or solder balls, to name a few. This goes hand in hand with a corresponding increase in the number of input/output (I/O) counts of a chip which is made possible by "flip-chip" technology that especially uses C4-technology, to build low cost, high performance, high I/O density assemblies. In these assemblies, metal bumps, studs, or balls of metals (collectively referred to herein as "bump-type" interconnections) are usually applied in a two dimensional array pattern, either directly to the active surface of a semiconductor chip, or alternatively, to an intermediate substrate carrier of the semiconductor chip. The assembly is made by flipping the active, bumped surface over and then aligning the bumps of the chip with corresponding pads on a substrate to which the electrical connection is to be made. The substrate may be either a part of a semiconductor chip package (such as the MCM, ceramic chip carrier, etc.) or a board level assembly.

FIG. 1 (similarly shown in U.S. Pat. No. 5,914,533) shows an exemplary MCM module 3. The module carries chips 1 and 2 are connected to the module by the C4-balls 4 and 5. The C4-balls 4 connect the signal I/Os of the chips 1 and 2 to the module whereas the solid C4-balls 5 connect the voltage and ground terminals of the chips 1 and 2 to the module 3. In the redistribution area of the module 3, the signals of the chips 1 and 2 are fanned out. This is necessary because of the narrow pitch (close spacing of pads)of the chip footprints. The redistribution section has the redistribution planes R1, R2, R3, R4, R5 . . . R14 as required. Each redistribution plane is interposed between power and ground GND mesh planes 6. The redistribution planes contain horizontal signal wiring 9 to fan out the signals. The vertical connections in the module 3 are established by vertical vias 7 and 8. The vertical vias 7 carry the signals and the vertical vias 8 carry power and ground. At the end of the redistribution section, logic service terminals (LST) provide the interface to the X/Y wiring area for larger size MCM when a large size chip is used. This X/Y wiring area is not always needed in smaller MCM designs and is optional. In such a case, the pins are then attached to the BSM layer. The X/Y wiring area comprises X/Y wiring planes which establish the connections from one chip to another chip or from one chip to the pins of the module 3. Note that only two wiring plane pairs X3/Y3 and X4/Y4 are shown. The fan-out capability with low noise functioning in the redistribution section is limited to I/O counts of around 500 to 700 signals.

Present MCM packages are produced by MCM computer aided design (CAD) software tools that are available from Mentor Graphics Inc., Cadence Viewlogic Systems Inc. and LSI Logic Inc. Such tools can lay out the design of die on a substrate and package an MCM design, wherein each with a given number of I/Os is wired separately. For example, given a 10 mm chip, the design might require that the MCM design include a first substrate design having 300 I/Os, a second substrate design that has 400 I/Os, and a third substrate design that has 500 I/Os. Each redistribution section of these three substrate designs form a composite MCM substrate design which are separately designed and not replicated. This represents significant design effort.

The prior art has approached MCM packaging design problems by various techniques. U.S. Pat. No. 5,777,383 (hereinafter '383 patent) discloses a way to package a semiconductor chip, which incorporates a plurality of levels of interconnecting conductive layers within the package which selectively direct signals to and from pins of the die and/or the pins of the package. The '383 patent uses a single general purpose chip that can be fabricated in large quantities with the interconnect of the package is used to define the specific purpose, functionality and pinout of the final device.

U.S. Pat. No. 6,048,753 (hereinafter '753 patent) discloses a standardized bonding location process for making a semiconductor chip device, wherein the resulting device has standardized die-to-substrate bonding locations. The '753 patent die provides a standardized ball grid or other array of a particular size, pitch and pattern such that as the size, configuration or bond pad arrangement of the die changes, a standard substrate, (the term including lead frames) having a similarly standardized array of terminals or trace ends is used to form the semiconductor device. The '753 patent can use dies having markedly different circuitry, but a common array pattern with the same substrate or other carrier.

These CAD tools for packaging MCM generally require several unique substrate designs for a given physical (menu) chip size having varying number of I/Os for each die, resulting in much custom design effort to package the MCM. The above prior techniques taught in the patents '383 and '753 typically have redesigned the top surface metallurgy (TSM) layer to interface with each die forming part of the MCM by customizing the TSM layer that requires much denser wiring, which in turn generally requires more time, material and expense to produce a resulting MCM design.

The present invention, however, solves these and other problems resulting in a packaged substrate by an improved method as more fully described in the following description taken along with the accompanying drawings.

SUMMARY OF THE INVENTION

The invention provides a method for packaging substrates of multi-chip modules (MCM) by reusing a generic repeatable substrate design for chips or dies having the same physical size by using a menu die having the greatest number of I/O wiring interconnections between the TSM and bottom surface metallurgical (BSM) layers. This global substrate design is referred to as "generic" substrate design, and is modified to accommodate different substrate designs for other dies having the same physical size. With the invention a customized lower redistribution layer accommodates each of the different designs. Moreover, unused I/O signal leads are terminated in the redistribution layer above the BSM layer. The "generic" substrate design provides a repeatable upper redistribution section wherein the vias for the I/O wiring is the same which can be reused in all substrate designs.

When designing a different substrate design for a die that has the same physical size as the generic chip, but which has a fewer number of I/O wiring requirements, the "generic" substrate design is reused, but the lower redistribution layers and the BSM layer are customized by deleting selected lower redistribution layers. The customized BSM layer is designed such that I/O signals and power/ground positions align properly with their respective board pins. Also, any unused I/O signals in the smaller substrate design are terminated by the customized BSM layer (note that prior known methods terminate unused I/O signals at the TSM layer as discussed above). With the invention, different substrate designs are available by use of the "generic" substrate that results in adding fewer wiring layers at the BSM layer by the inventive fan-out design technique.

Additionally, the invention can be incorporated in a MCM-CAD tool package that initially determines what generic (global) substrate design (i.e., the "generic" substrate design) will accommodate all same sized chips. The tool can then reuse this "generic" substrate design for other substrate designs using this "generic" substrate design since the upper portions of the redistribution layers for both the "generic" substrate design and a specific substrate design are the same. When a different substrate design is required, a customized BSM layer is provided so that connections with the external board pins are determined by deleting lower redistribution layers of, and interfacing the customized BSM layer with, one of these redistribution layers.

One object of the invention includes the reduction in time required to produce an MCM package design using this "generic" substrate design technique. In effect, the design of the "generic" substrate design can be reused to easily create different substrate designs. The design of a different substrate requires a customized BSM layer and may use previously unused I/O signal wire leads.

Another object of the invention includes packaging an MCM having a top layer with dies of the same size attached. One of these dies provides the "generic" substrate design. This die requires the greatest number of input/output (I/O) signals compared to all the dies that are used in similar packaging and have the same size. The redistribution layers of the package include vias for electrical interconnections for both power and the I/O signal leads between interface terminals of each of the dies and a bottom surface metallurgy (BSM) layer, which has electrical connector pads. Each of the dies in the package have a similar substrate design within the upper layers of the redistribution sections of the package. By using the "generic"substrate design, the cost of producing a substrate design for a package is substantially reduced.

Another object of the invention is to provide a computer aided design (CAD) tool for the electrical layout of a package having integrated circuit wafer dies of the same size, wherein one of these dies provides a "generic" substrate design for all substrate designs. The assembly contains a plurality of redistribution layers with vias for making wiring interconnections. The CAD tool determines the "generic" substrate design for all the dies having the same physical size, by including sufficient input/output (I/O) signal wires to accommodate all chips that will be mounted on the MCM. Next, the CAD tool uses this "generic" substrate design as a replica for the electrical layout of the upper redistribution layers of the assembly. The CAD tool next connects a customized BSM layer of the assembly to delete redistribution layers from the entire package. The tool then determines placement of external connections of the BSM to terminals of the assembly by locating a board interface located at the bottom surface of the assembly.

BRIEF DESCRIPTION OF THE DRAWINGS

The drawings are for exemplary purposes. Like numbers represent like features in the drawings. The invention itself, however, may best be understood by reference to the detailed description which follows taken in conjunction with the accompanying drawings in which.

DETAILED DESCRIPTION OF PREFERRED EMBODIMENTS OF THE INVENTION

Figure 2A:
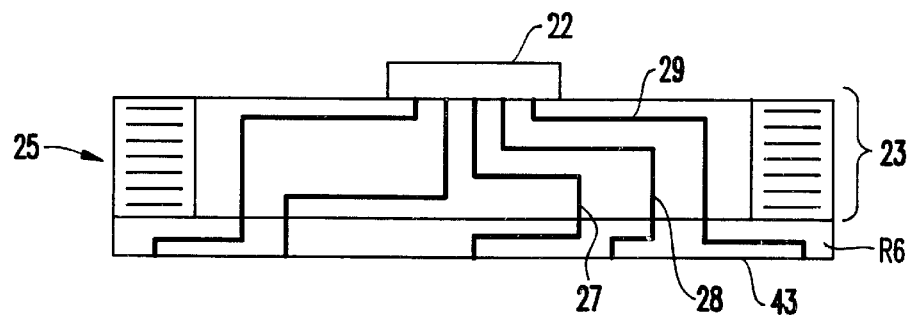
FIG. 2a shows a cross-sectional view of a largest substrate design for a chips having the same size that provides a "generic" substrate design with a BSM layer.

In FIG. 2a, the invention determines which die has the greatest number of I/O signals. Once this determination is made, the die 22 (a chip in exemplary form), is referred to as a "generic" chip. This substrate design includes multiple redistribution layers R1 through R6 (as shown) that form the basis of a "generic" substrate design. The upper layers of the redistribution region 23 for the chip 22 are the same as chip 21 (shown in FIG. 3a), except for layer R6. This composite substrate design includes all "used" I/O signal connections and "unused" I/O signal connections for all chips having this same chip size. The invention wires all the "used" I/O wiring through vias in the redistribution section 23 to an interfacing BSM layer 43, regardless of magnitude of potential signals (unused) that are wired at least one layer above the customized BSM layer. When a subsequent different substrate design is required, the "generic" substrate design can be modified by customizing the fanned-out redistribution layers of the composite MCM substrate structure.

Figure 2B:
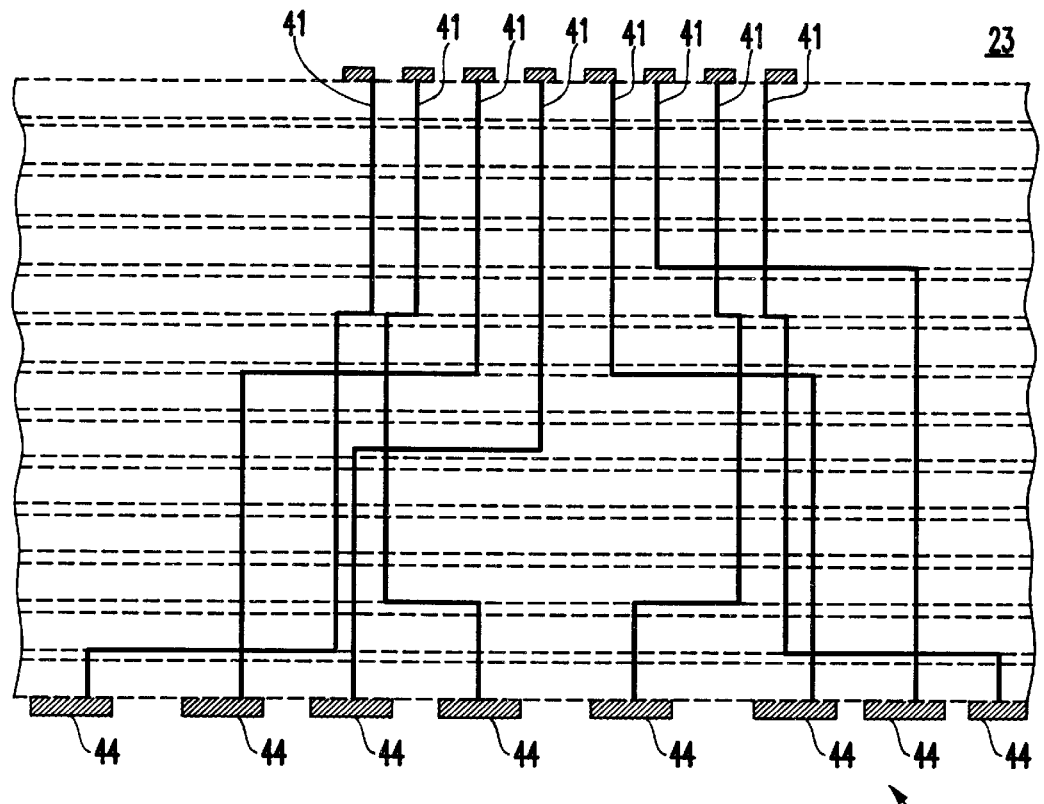
FIG. 2b shows the redistribution section of the MCM design as to "used" I/O wires using the "generic" substrate design with the BSM layer.

In FIG. 2b, the redistribution section 23 of the MCM design shown in FIG. 2a is provided wherein the "used" I/O lead wires 41 are shown using the "generic" substrate design. The "U" signals 42 are wired, wherein the BSM layer 43 have connections 44 as shown for the generic substrate design.

Figure 1:
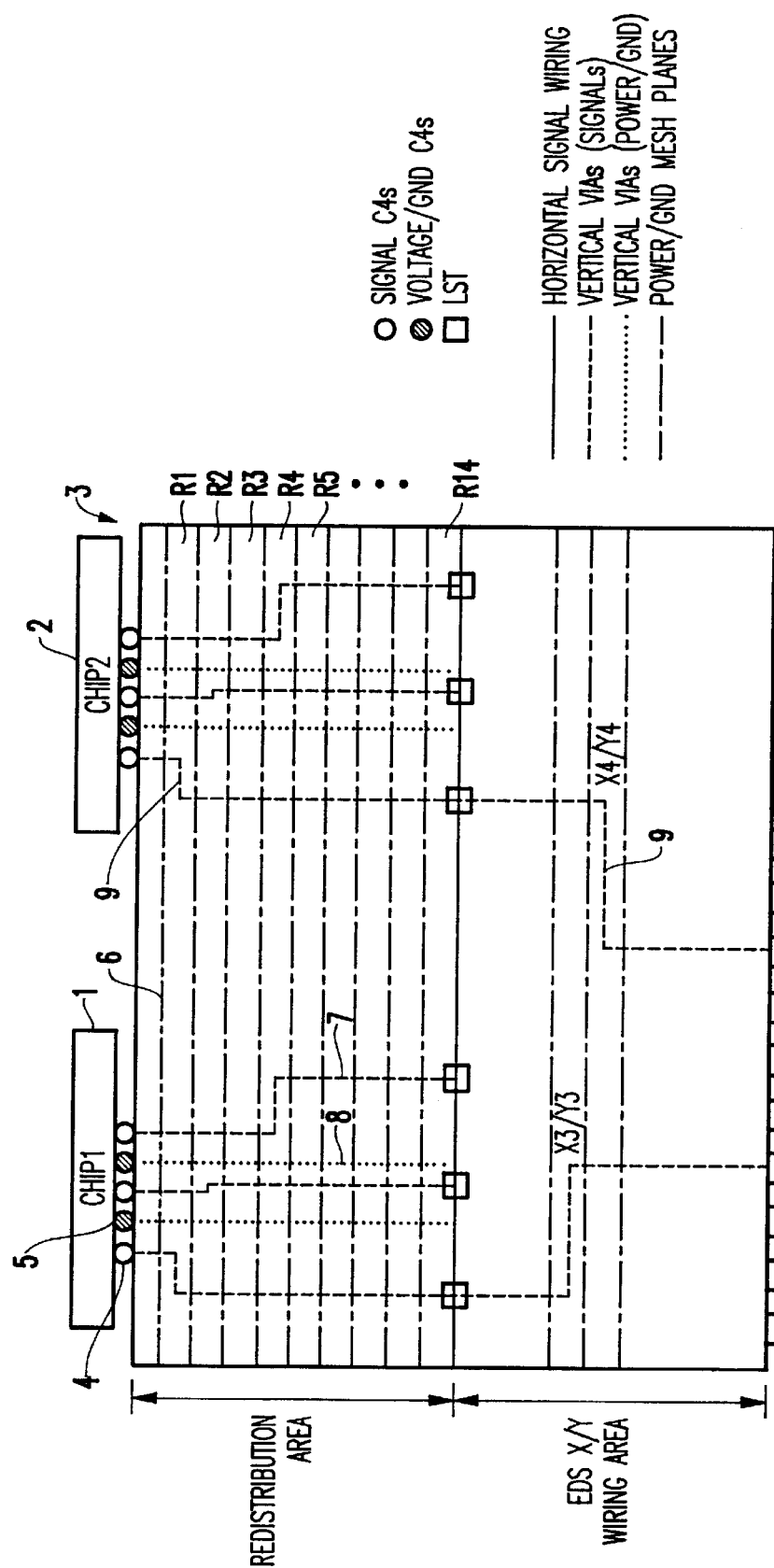
FIG. 1 is a cross sectional view of a typical multilayer ceramic module (MCM)

Optionally, at the bottom of the redistribution section 23, the X/Y wiring area can be included in larger MCM substrate designs as shown in FIG. 1, wherein these layers are interposed between a customized BSM layer and a bottom layer of the redistribution section 23. This wiring X/Y area is not necessary in smaller MCM designs depending on the package size.

Figure 3A:
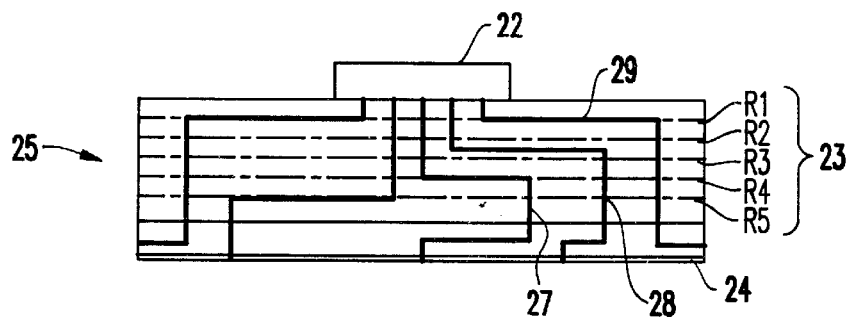
FIG. 3a shows a cross-sectional view of a smaller substrate design for a chip having fewer I/O connections with a customization layer to illustrate the invention.

Referring now to FIG. 3a, an exemplary customized substrate design of an MCM package is shown to illustrate the invention using the "generic" substrate design of chip 22. In the middle layers (redistribution section) 23, having layers R1, R2, R3, R4 and R5, the I/O leads fan-out. The redistribution section 23 in MCM designs typically has four or five layers that contain the horizontal signal wiring 29 that fan-out the I/O signals to the BSM layer 24 connections. The vertical connections in the module are established by vertical vias 27 and 28. The vertical vias 27 carry signals.

Figure 3B:
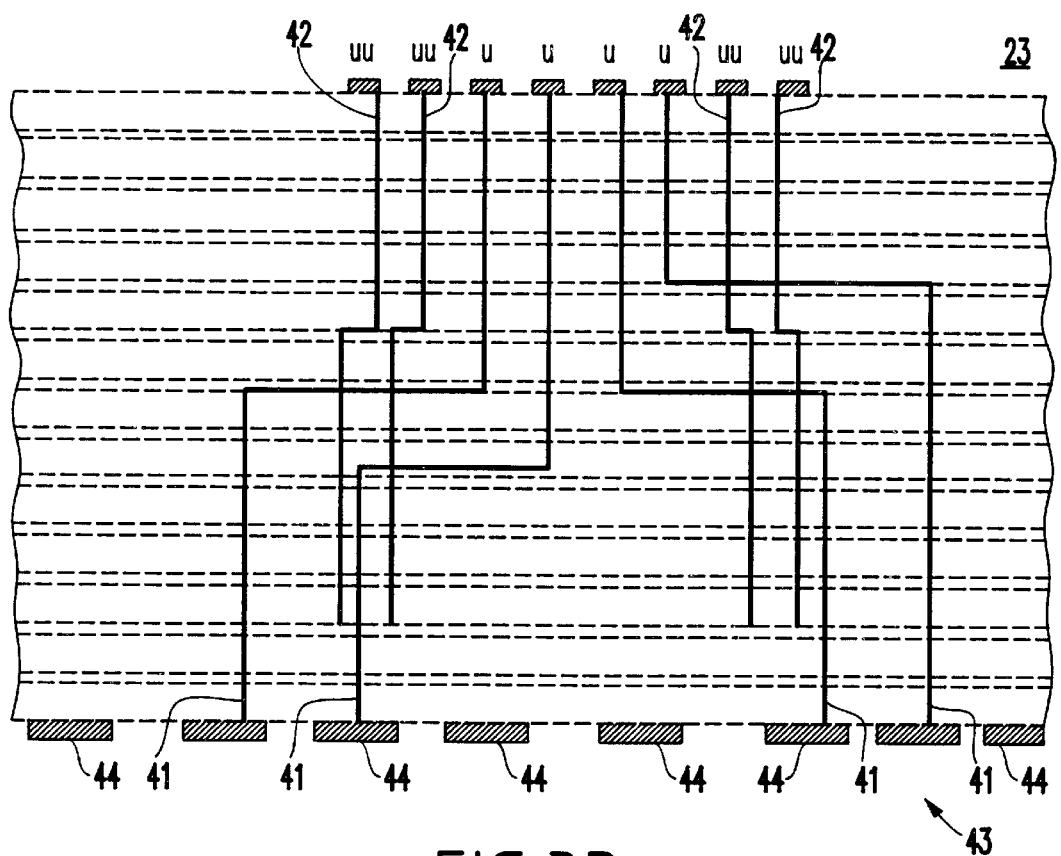
FIG. 3b shows middle layers (redistribution section) of an MCM substrate design as to "used" and "unused" I/O signal wiring leads using the "generic" substrate with the customized layer shown.

In FIG. 3b, an exemplary redistribution section 23 of an MCM design of the substrate is shown with used (labeled "U") I/O signals wire leads 41 and unused (labeled "UU") I/O signal wire leads 42. The BSM layer 43 is shown with multiple pad connections 44. The unused I/O signal wires 42 are terminated on the smaller upper redistribution layers at layers above a customization layer that interfaces with the bottom BSM layer 43 such that it is as close to the perimeter as possible. This allows maximum flexibility to connect chips having a greater number of connections.

Figure 4A:
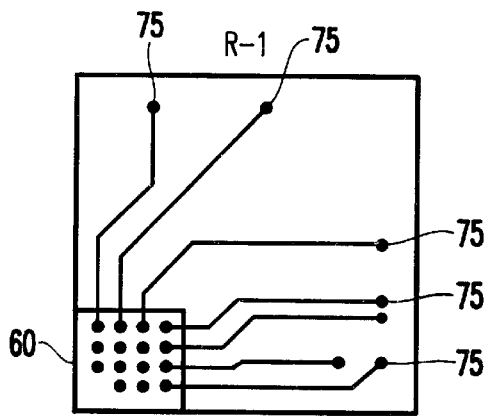
FIGS. 4a, 4b and 4c shows an example of using the invention having R1, R2 and R3 redistribution layers as art of the "generic" substrate design.
Figure 4C:
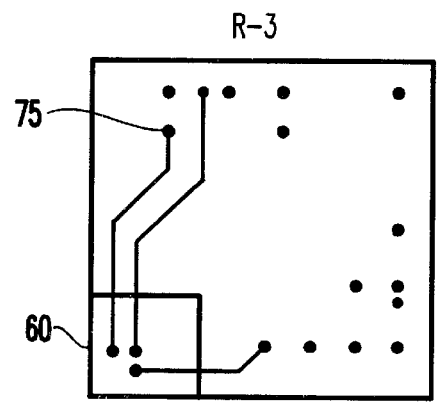
Figure 4B:
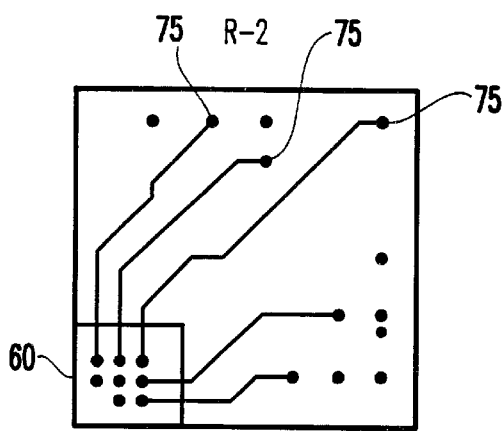
Figure 5A:
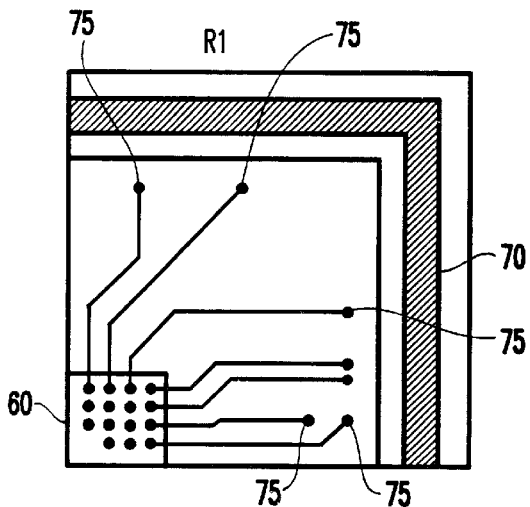
FIGS. 5a, 5b, 5c and shows the R1, R2 and R3 layers as shown in FIGS. 4a, 4b and 4c in the "generic" substrate, wherein an outer metal layer provides an additional redistribution layer R4 that is used.
Figure 5C:
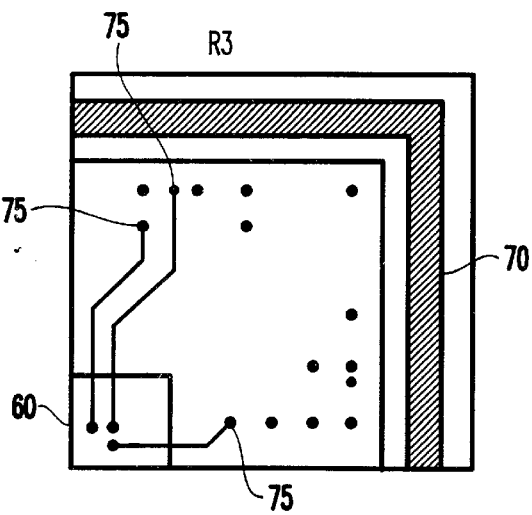
Figure 5B:
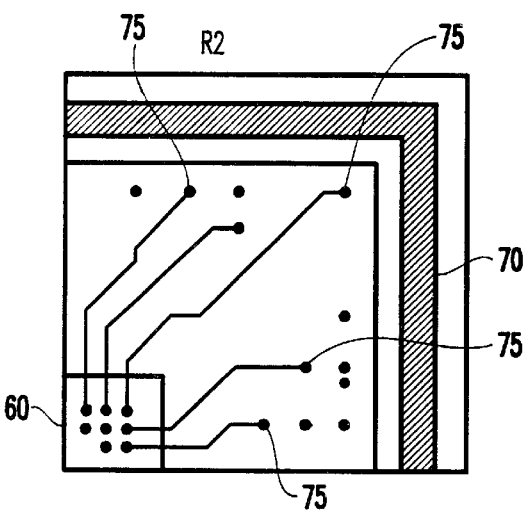
Figure 5D:
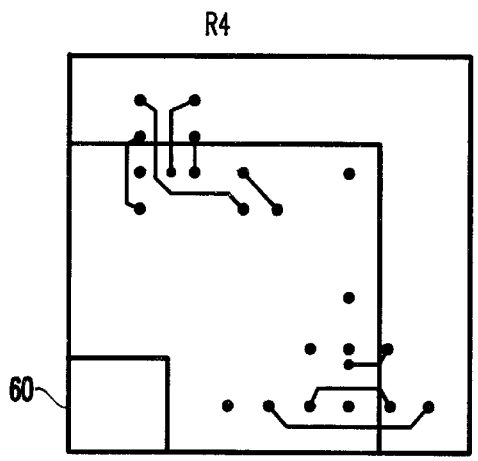

The following example is intended to further illustrate the invention and is not intended to limit the scope of the invention. In FIGS. 4a, 4b and 4c, an example is provided wherein the R1, R2 and R3 layers forming the redistribution section 23 are shown using an exemplary "generic" substrate design for chip 21. These redistribution layers fan-out I/O signals to the BSM layer through the vias for placement of I/O wire leads. The wiring interconnections for chip 21 overlie the box 60 wherein the nodes 65 (dots) form the vias for wiring of the chip interconnections. In FIGS. 5a, 5b, 5c and 5d, reuse of the R1, R2 and R3 layers shown in FIGS. 4a, 4b and 4c for a larger substrate design wherein an outer metal layer 70 forms the added redistribution layer R4 by using the inventions fan-out design technique that interconnect with nodes 75 for additional I/O signals used with the larger substrate design.

Another aspect of the invention is that the "generic" substrate design can be "reused" and archived by storing it in the memory of a computer aided design (CAD) tool. This "generic" substrate design can be stored, cataloged and recalled as needed, thereby allowing reduced design cycle time of application specific integrated circuits. Typical CAD software tool packages that can implement the invention as an add-on tool feature include tool packages made by Mentor Graphics, Inc. of Beaverton, Oreg., USA; Cadence Design Systems, Inc., of San Jose, Calif., USA; Viewlogic Systems, Inc. of Marlboro, MA, USA; and an application referred to as "Toolkit," made by LSI Logic Corp. of Milpitas, Calif., USA.

The I/O signal wire leads 42, 43 and bond pad connection of the BSM layer for component-to-component and component-via interconnection can be accomplished by an MCM-CAD tool known as "Allegro" made by Cadence Design Systems Inc., and "MCM Station" made by Mentor Graphics, Inc. The invention, while described in terms of "generic" substrate designs, entails concepts which are broad enough to be applicable to plastic packages and board designs as well.

Figure 6:
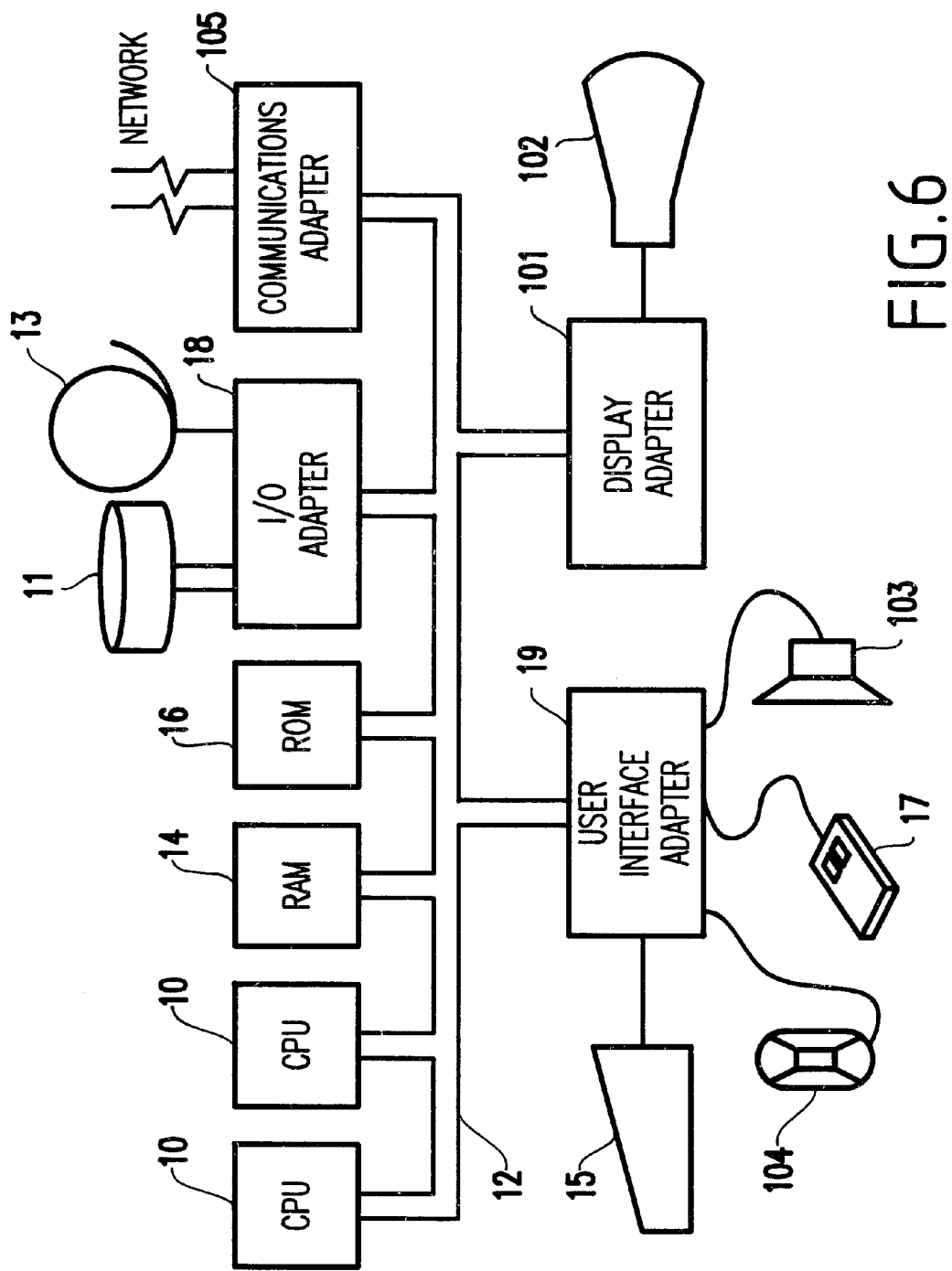
FIG. 6 shows a typical computer system environment for running a computer-based CAD tool to implement the invention.

A representative hardware environment for practicing the present invention is shown in FIG. 6, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units, is used to load the instructions which operate on a wiring interconnect design which is loaded also loaded onto the computer system.

A major advantage of the invention is significant design cycle time reductions. A single "generic" substrate design of a class of chips having the same size can be reused in other MCM designs, thus avoiding the redesigning of unique substrate designs for every chip of an MCM. The invention provides a packaging design technique for a multi-chip substrate module which supports a "generic" substrate design of a chip having the greatest number of I/O signals. In menu driven chip applications, the same physically sized chip can be reused on different size chip carriers or ceramic substrates that have the same size. All chips using the technique of the invention have the same physical dimensions and the exact same number and location of C4's (chip I/O). All chips can also have the same number of power and ground lead wiring connections using C4 technology, with differing number of used (or active) signal lead wires 41 C4's that connect with the BSM layer having respective connecting pins. The chips with larger number of used C4's define the "generic" substrate design for a menu chip having requisite BSM-I/O connections.

The invention entails a design technique which involves the initial design of a chip which has the greatest "used" I/O signal-C4 connections. While used and functional in one application, the invention can be used in future applications using chips with fewer "used" I/O signal C4's, thereby reducing the design cycle time for packaging a ceramic substrate by using the same "generic" substrate design. In effect, the design of the "generic" substrate design is reused to create different substrate designs having fewer I/O signal requirements. The design of these different substrates is accomplished using a customization layer that interfaces with the BSM layer for wiring fewer signal and voltage layers at the top of the substrate. Unused I/O signal wires terminate at a layer above the BSM layer.

While the invention has been described in terms of preferred embodiments, those skilled in the art will recognize that the invention can be practiced with modification within the spirit and scope of the appended claims.

What is claimed is:

1. A substrate adapted to connect to a menu of same-sized semiconductor chips having the same number and location of chip input/output connections but a differing number of used input/output connections, said substrate comprising:

a top layer;

a plurality of upper redistribution layers;

at least one customized lower redistribution layer;

a bottom layer; and wires running from said top layer through said plurality of upper redistribution layers which wire out all used and unused input/output connections for said menu of same-sized chips thereby forming a generic substrate design, wherein said wires are generic to all said menu of same-sized semiconductor chips, and customization of said substrate for a specific semiconductor chip is performed by altering said at least one customized lower redistribution layer to prevent selected ones of said wires from connecting said top layer to said bottom layer.

2. The substrate of claim 1, wherein said bottom layer matches said wires that pass through said customization layer to said bottom layer.

3. The substrate of claim 2, wherein said bottom layer includes external contacts and a number and location of said external contacts are changed to selectively accommodate said customization layer.

4. The substrate of claim 1, wherein said customization layer selectively terminates said wires such that only wires needed by a corresponding chip are allowed to pass from said top layer to said bottom layer.

5. The substrate of claim 1, wherein said top layer includes a pattern of external contacts that is generic to all of said same-sized semiconductor chips.

6. The substrate of claim 1 wherein said menu of same-sized semiconductor chips are placed on substrates of differing sizes.

7. An integrated circuit chip package comprising:

a substrate having a top layer, a plurality of upper redistribution layers, at least one customized lower redistribution layer, and a bottom layer;

at least one integrated circuit chip, selected from a menu of same-sized chips having the same number and location of chip input/output connections but a differing number of used input/output connections, mounted on said top layer of said substrate; and wires running from said top layer through said plurality of upper redistribution layers, wherein said at least one customization layer is altered to prevent selected ones of said wires from connecting said top layer to said bottom layer, and wherein said at least one customization layer allows said substrate to be used as a generic substrate for said menu of same-sized integrated circuit chips.

8. The chip package of claim 7, wherein said bottom layer matches said wires that pass through said customization layer to said bottom layer.

9. The chip package of claim 8, wherein said bottom layer includes external contacts and a number and location of said external contacts are changed to selectively accommodate said customization layer.

10. The chip package of claim 7, wherein said customization layer selectively terminates said wires such that only wires needed by a corresponding chip are allowed to pass from said top layer to said bottom layer.

11. The chip package of claim 7, wherein said top layer includes a pattern of external contacts that is generic to all of said same-sized semiconductor chips.

12. The chip package of claim 7 wherein said menu of same-sized semiconductor chips are placed on substrates of differing sizes.

13. A method for manufacturing a substrate for a menu of same-sized semiconductor chips having the same number and location of chip input/output connections but a differing number of used input/output connections, said method comprising:

determining the greatest number of used and unused input/output connections for a given menu of chips;

forming a top layer;

forming a plurality of upper redistribution layers below said top layer, forming at least one customized lower redistribution layer;

forming a bottom layer;

forming wires running from said top layer through said upper redistribution layers which wire out all used and unused input/output connections for said menu of chips thereby forming a generic substrate design, wherein said wires are generic to all said menu semiconductor chips; and customizing said substrate for a specific semiconductor chip by altering said at least one customization layer to prevent selected ones of said wires from connecting said top layer to said bottom layer.

14. The method of claim 13, further comprising customizing said bottom layer matches said wires that pass through said customization layer to said bottom layer.

15. The method of claim 13, wherein said forming of said bottom layer includes forming external contacts and changing a number and location of said external contacts to selectively accommodate said customization layer.

16. The method of claim 13, wherein said customizing of said substrate includes selectively terminating of said wires such that only wires needed by a corresponding chip are allowed to pass from said top layer to said bottom layer.

17. The method of claim 13, wherein said forming of said top layer includes forming a pattern of external contacts that is generic to all of said same-sized semiconductor chips.

18. The method of claim 13 wherein said menu of same-sized semiconductor chips are placed on substrates of differing sizes.

* * * * *